(12) United States Patent
Koga

(10) Patent No.: US 6,177,331 B1
(45) Date of Patent: Jan. 23, 2001

(54) METHOD FOR MANUFACTURING SEMICONDUCTOR DEVICE

(75) Inventor: Hiroki Koga, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/089,406

(22) Filed: Jun. 3, 1998

(30) Foreign Application Priority Data

Jun. 4, 1997 (JP) .................................... 9-146480

(51) Int. Cl.$^7$ .................................................. H01L 21/76
(52) U.S. Cl. ........................ 438/424; 438/701; 438/713; 438/978
(58) Field of Search .................. 438/424, 427, 438/435, 437, 978, 701, 713

(56) References Cited

U.S. PATENT DOCUMENTS 5,811,315 * 9/1998 Yindeepol et al. .......... 148/DIG. 50
5,895,254 * 4/1999 Huang et al. .................... 438/424
5,933,749 * 8/1999 Lee ................................. 438/435

FOREIGN PATENT DOCUMENTS

| 56-103446 | 8/1981 | (JP) . |
| 63-232349 | 9/1988 | (JP) . |
| 5-129179  | 5/1993 | (JP) . |
| 8-227935  | 9/1996 | (JP) . |

\* cited by examiner

*Primary Examiner*—Trung Dang
(74) *Attorney, Agent, or Firm*—Foley & Lardner

(57) ABSTRACT

In order to provide a method for manufacturing a semiconductor device in which, in a trench isolation process of the semiconductor device, any void is not formed in trenches and a repeating pitch of the trench isolation can be reduced to the limitations of a lithography technique, the method of the present invention comprises, in the trench isolation process, a step of etching a silicon substrate through a hard mask to form trenches, and a step of processing the hard mask so that its upper portion may be tapered.

9 Claims, 5 Drawing Sheets

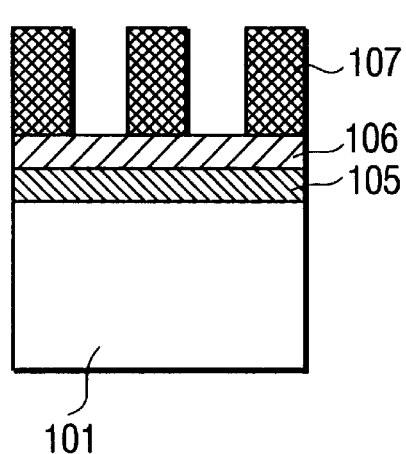
FIG. 3(a)
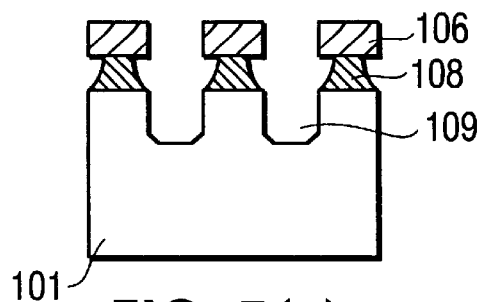
FIG. 3(d)
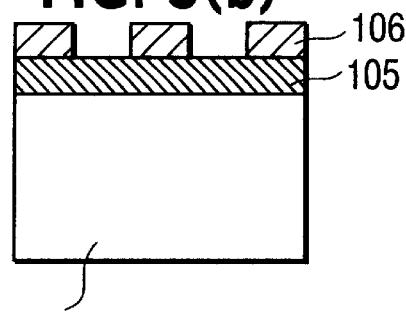
FIG. 3(b)
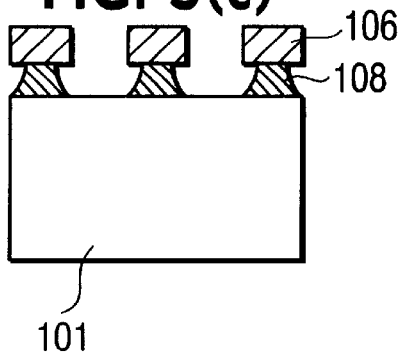
FIG. 3(c)
FIG. 3(e)
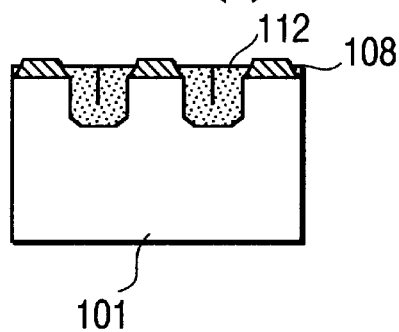
FIG. 3(f)
FIG. 3(g)
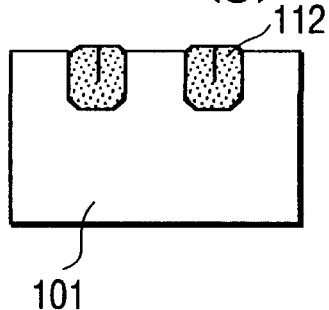

METHOD FOR MANUFACTURING SEMICONDUCTOR DEVICE

BACKGROUND OF THE INVENTION

1. Field of the Invention

The present invention relates to a method for manufacturing a semiconductor device, and more particularly, it relates to a method for trench isolation;

2. Description of the Related Art

One example of conventional methods for trench isolation is shown by a sectional view of a process in FIG. 4.

In the first place, as shown in FIG. 4(a), a silicon dioxide film 202 and a silicon nitride film 203 are successively formed on a silicon semiconductor substrate 201, and a resist pattern 207 is then formed in an area, where will become an element region, by the use of a lithography technique.

Next, as shown in FIG. 4(b), unnecessary portions of the silicon nitride film 203 and the silicon dioxide film 202 are etched and removed through the resist pattern 207 as a mask by the use of an anisotropic dry etching technique. Afterward, the resist pattern 207 is removed.

Next, as shown in FIG. 4(c), the silicon substrate 201 is vertically etched to a predetermined depth through the silicon nitride film 203 as an etching mask by the use of the anisotropic dry etching technique, thereby forming trenches 208.

Afterward, as shown in FIG. 4(d), a silicon dioxide film 212 is formed all over by the use of a chemical vapor deposition (CVD) method. The thickness of this silicon dioxide film 212 must be at least thicker than the depth of the trenches 208.

On the other hand, the step coverage of a silicon dioxide film by CVD method which has now been used does not attain 100%, so that the thickness of the silicon dioxide film deposited on a sidewall is smaller than that of the silicon dioxide film deposited on a horizontal face. In addition, a velocity at which the silicon dioxide film is deposited on the corner of a step is higher than a velocity at which it is deposited on a side face. Consequently, in the conventional technique, a void 213 is inconveniently formed in each of the trenches 208 during a step of burying the silicon dioxide film 212 into the trenches 208.

Next, as shown in FIG. 4(e), the whole surface of the substrate is polished back by a chemical mechanical polishing (hereinafter referred to as "CMP") method. In this case, a polishing amount is at least such that the previously formed and deposed silicon nitride film 203 is exposed but is not lost. By this polishing, a part of the void 213 in the trench might be exposed on the silicon dioxide film.

Lastly, as shown in FIG. 4(f), the silicon nitride film 203 and the silicon dioxide film 202 are successively removed by wet etching. By carrying out this wet etching, the thickness of the silicon dioxide film in the trenches is further decreased, so that the void 213 is more largely exposed. Moreover, if an etchant such as an aqueous hydrofluoric acid solution for the etching of the silicon dioxide film is put in the void 213, the void 213 is further etched, so that they might be enlarged.

As understood form the foregoing, when the trench isolation is done by the use of the conventional technique, voids or holes are formed in the silicon dioxide film with which the trenches are filled. If a gate electrode material is put in the voids, the conductive material in the voids cannot be removed completely at the time of gate etching, so that a short-circuit might occur between the gate electrodes.

The cause of this defect is that the deposition rate of the silicon dioxide film at the upper corners of the trenches is higher than that of the film on the side portions thereof. Therefore, the upper portions of the trenches are closed with the silicon dioxide film before the trenches are buried completely, so that the voids are formed in the trenches.

In order to solve the above-mentioned problem, a technique has been suggested which is described in Japanese Patent Application Laid-open No. 103446/1981. Here, this technique will be described in accordance with FIGS. 5(a) to 5(e).

In the first place, as shown in FIG. 5(a), a silicon dioxide film 204 and a silicon nitride film 205 are successively formed on a semiconductor substrate 201 obtained by the epitaxial growth of silicon on a silicon substrate. On this nitride film 205, a resist pattern 207 is then formed by a lithography technique.

Next, as shown in FIG. 5(b), the silicon nitride film 205, the silicon dioxide film 204 and the semiconductor substrate 201 are etched through the resist pattern 207 as a mask by the use of an anisotropic dry etching technique to form trenches 208. These trenches have an equal width in their sectional views.

Next, as shown in FIG. 5(c), the resist pattern 207 is removed by an ashing method or the like. Furthermore, the opening of the silicon dioxide film 204 is enlarged to a desired size with a hydrofluoric acid-containing agent. Afterward, anisotropic etching is carried out through the silicon dioxide film 204 as a mask by the use of a potassium hydroxide (KOH) solution or an ethylenediamine solution. At this time, silicon on the shoulder portions of the trenches 208 is removed therefrom, so that the upper portions of the sidewalls of the trenches 208 become slopes. In consequence, each trench comprises an equal width portion and a tapered upper portion continuous therewith in a sectional view.

The subsequent procedure is advanced in accordance with a usual process. That is to say, as shown in FIG. 5(d), a silicon dioxide film 212 is formed all over by the use of the CVD method to bury the trenches therewith, and the whole surface is polished back by the CMP method and the silicon nitride film 205 is then removed by wet etching. Next, the silicon dioxide film 204 is removed by the wet etching method to accomplish a trench isolation as shown in FIG. 5(e). According to this conventional technique, any voids are not formed any more in the vicinity of the surface of the silicon substrate in the step of burying the trenches 208 with the silicon dioxide film 212, because the upper portions of the trenches have an enlarged width.

For example, a pitch of a trench and an element region is represented by P as shown in FIG. 5(e). This pitch P is the sum of a trench width and an element region width represented by w, but the trench width and the element region width are usually decided as follows. That is to say, the trench width is required to be equal to or larger than a width which permits an electrical isolation. At this time, for example, in a layout of a memory such as a DRAM, a gate array or the like in which the high integration degree of an array is necessary, a minimum width which permits the electrical isolation is used as the trench width. Furthermore, the element region width is decided by the channel width of a transistor, the diameter of a contact hole connected to the element region and a distance between the contact hole and the edge of the element region. In general, it is required that the element region width is decreased to the utmost. Hence, the pitch P of the trench isolation and the element region is the sum of the minimum trench width and the minimum element region width just mentioned. Decreasing this pitch P is important to heighten the integration degree of the memory or the gate array.

However, this pitch P is now restricted by the limitations of a lithography technique in most cases. In other words, a resolution limit of a pitch pattern of the lithography technique is larger than the lower limit of the electrical pitch.

In this connection, a problem of the conventional technique is that when the pitch P for the trench isolation formed by the conventional technique shown in FIG. 5(e) is decreased to the limitations of the lithography technique, the width W of the element region is decreased because the upper portions of the trenches are obliquely etched. Furthermore, if it is attempted that a certain or more width W of the element region is obtained, the pitch P is required to be set in consideration of the oblique wide upper portions of the trenches. That is to say, the pitch for the trench isolation cannot be decreased to the limitations of the lithography technique. This reason is that the oblique upper portions of the trenches do not contribute to the essential element isolation and so they are unnecessary from the viewpoint of the electrical element isolation, but they are required to be formed only for the sake of preventing the voids from being formed in the trenches.

SUMMARY OF THE INVENTION

Accordingly, an object of the present invention is to provide a method for manufacturing a semiconductor device in which any voids are not formed in trenches in a trench isolation process of the semiconductor device and a repeating pitch for the trench isolation can be decreased to the limitations of a lithography technique. By decreasing the pitch of an array, a further high integration of the semiconductor device can be accomplished.

In order to achieve this object, a method for manufacturing a semiconductor device of the present invention is characterized in that a process for trench isolation comprises a step of trench-etching a silicon substrate through a hard mask, and a step of forming the hard mask having a tapered upper portion.

That is to say, a first aspect of the present invention is directed to a method for manufacturing a semiconductor device having an element isolation region which at least comprises steps of:

forming an insulating film on the surface of a semiconductor substrate, forming an insulating film mask by etching the insulating film into a predetermined shape, forming a trench by etching the semiconductor substrate through the insulating film mask, processing the insulating film mask into taper shape so that the width of the upper portion of the insulating film mask may be smaller than that of the lower portion thereof, and burying an insulating material into the trench.

A second aspect of the present invention is directed to the method for manufacturing a semiconductor device wherein the step of processing the insulating film mask into taper shape is performed by a physical sputtering process.

A third aspect of the present invention is directed to the method for manufacturing a semiconductor device wherein the insulating film mask comprises a silicon oxide film or a laminated film of the silicon oxide film and a silicon nitride film.

A fourth aspect of the present invention is directed to a method for manufacturing a semiconductor device having an element isolation region which at least comprises steps of:

forming a first insulating film on the surface of a semiconductor substrate, forming a second insulating film on the first insulating film, subjecting the second insulating film to an anisotropic dry etching to accomplish patterning, wet-etching the first insulating film through the second patterned insulating film as a mask by the use of an agent capable of etching the first insulating film to process the first insulating film into a taper shape so that the width of the upper portion of the first insulating film may be smaller than that of the lower portion thereof, etching the semiconductor substrate to form a trench, and burying the trench with an insulating material.

A fifth aspect of the present invention is directed to the method for manufacturing a semiconductor device wherein the first insulating film is a silicon oxide film, and the second insulating film is a silicon nitride film.

In the step of burying trenches with an insulating material in a method of the present invention, the trenches can be filled with the insulating material without forming any voids in the trenches, because a hard mask above the trenches has wide openings which are obliquely etched in a taper shape. Furthermore, since the hard mask is obliquely etched above the trenches, a repeating pitch can be reduced to the limitations of a lithography technique without enlarging the width of a trench isolation. By the use of this manufacturing method, the repeating pitch of the trench isolation can be reduced about 30% in the case that the trench isolation is accomplished in the vicinity of the limitations of the lithography technique than in the case that a conventional technique is used.

BRIEF DESCRIPTION OF THE DRAWINGS

FIGS. 3(a)–(g) are sectional views of process steps illustrating a third embodiment of the present invention.

DETAILED DESCRIPTION OF THE PREFERRED EMBODIMENTS

According to the above-mentioned constitution, there is provided a method for trench isolation in a semiconductor device where, in a step of burying an insulating material into a trench, the trenches can be filled with the insulating material without forming any voids in the trenches, because a hard mask above the trenches has wide openings which are obliquely etched in a taper shape, and since the hard mask is obliquely etched, a repeating pitch of a trench isolation can be reduced to the limitations of a lithography technique without enlarging the width of the trench isolation.

Next, the present invention will be described in more detail in accordance with examples, but the scope of the present invention should not be limited to these examples alone.

EXAMPLE 1

The first example of the present invention will be described with reference to a sectional view of process steps shown in FIG. 1.

Figure 1A:
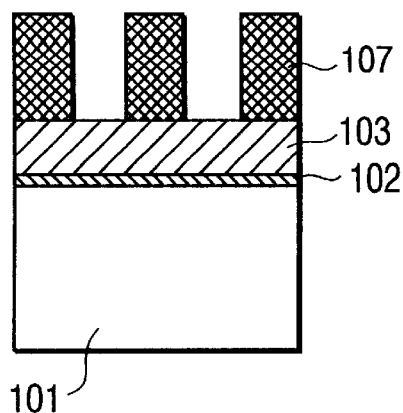
FIGS. 1(a)–1(g) are sectional views of process steps illustrating a first embodiment of the present invention.

In the first place, as shown in FIG. 1(a), a silicon dioxide film 102 having a thickness of 20 nm was formed on a silicon substrate 101 by the use of a thermal oxidation method. Next, a silicon nitride film 103 having a thickness of 200 nm was then formed thereon by a CVD method. Afterward, a resist pattern 107 was formed by the use of a lithography technique. The formation of this resist pattern 107 was done in an area in which an element region would be formed later on.

Figure 1D:
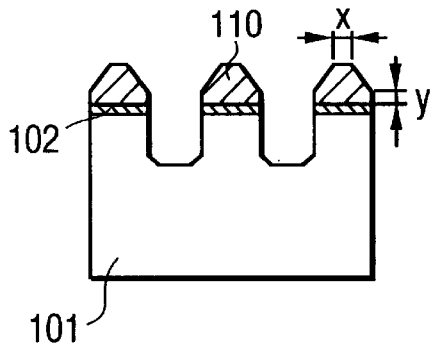
Figure 1B:
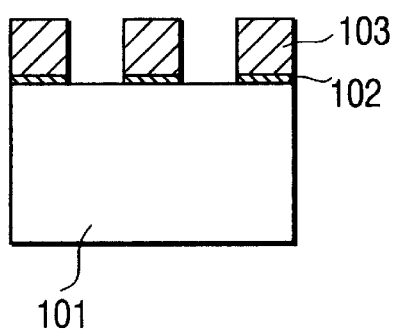

Next, as shown in FIG. 1(b), unnecessary portions of the silicon nitride film 103 and the silicon dioxide film 102 were etched and removed through the resist pattern 107 as an etching mask by the use of an anisotropic dry etching technique. Afterward, the resist pattern 107 was removed by an ashing method.

Figure 1E:
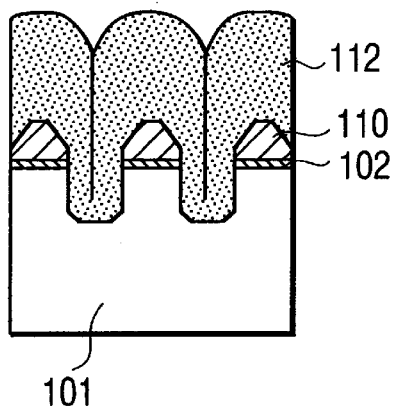
Figure 1C:
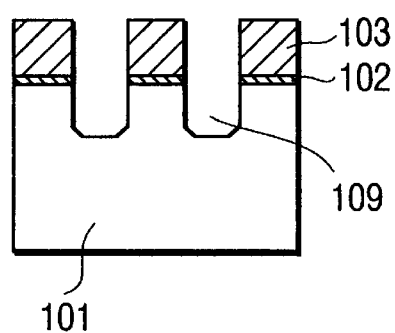

Next, as shown in FIG. 1(c), the silicon substrate 101 was etched to a depth of 300 nm through the remaining silicon nitride film 103 as a mask by the use of the anisotropic dry etching technique to form trenches 109.

Next, as shown in FIG. 1(d), shoulder portions of the silicon nitride film 103 used as the hard mask at the time of the formation of the trenches were etched by the use of a physical sputtering process to form a silicon nitride film 110 into a taper shape. This physical sputtering process was carried out by using a parallel plate reactive ion etching (RIE) apparatus and an argon gas as a sputtering gas at 200 sccm under 100 mTorr at a radio frequency (RF) power of 400 W. In this example shown in FIG. 1(d), the hard mask formed into the taper shape by the physical sputtering process has both of an upper flat portion x and a vertical side portion y, but needless to say, the physical sputtering process may be continued without any problem until both or either of the portions x and y is lost.

Next, as shown in FIG. 1(e), a silicon dioxide film 112 having a thickness of 500 nm was formed all over by the use of a CVD method. The thickness of this silicon dioxide film 112 is required to be sufficiently thicker than the depth of the trenches 109. Since the silicon nitride film 110 arranged above the trenches 109 is formed into the taper shape, the silicon dioxide films 112 come in contact with each other in a corner above each trenches 50 that any void is not formed in the trench, even if the step coverage of the silicon dioxide film 112 deposited by the CVD method does not attain 100%.

Figure 1F:
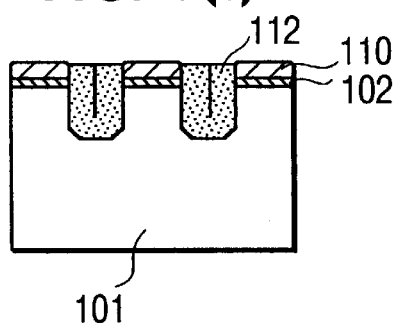

Next, as shown in FIG. 1(f), the silicon dioxide film 112 was polished back by the use of a CMP method. The polishing time of this polishing back is set so that the silicon nitride film 110 may be exposed but may not be lost.

Figure 1G:
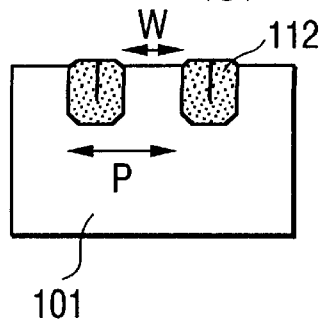

Next, as shown in FIG. 1(g), the remaining portion of the silicon nitride film 110 polished back was wet-etched by a heated aqueous phosphoric acid solution to remove the same. In succession, the silicon dioxide film 102 was wet-etched by an aqueous hydrofluoric acid solution.

According to the thus prepared semiconductor device, a repeating pitch P of the trench isolation can be sufficiently reduced to the limitations of a lithography technique, and a width W of a sufficient element region can be secured.

In the present invention, the semiconductor substrate is first etched to form a trench, and the insulating film mask is then processed into a taper shape so that the upper width of the mask may be smaller than the lower width thereof. However, the insulating film mask may be first processed into a taper shape, and the trench may be then formed in the semiconductor substrate.

EXAMPLE 2

Figure 2A:
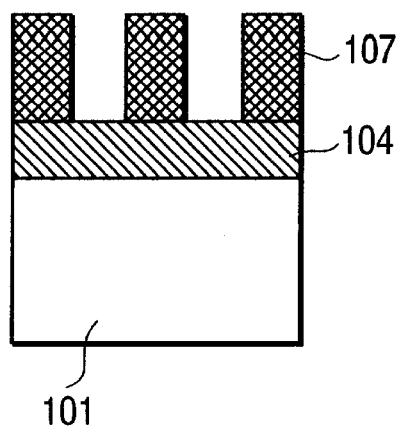
FIGS. 2(a)–(g) are sectional views of process steps illustrating a second embodiment of the present invention.

Next, the second example of the present invention will be described with reference to FIG. 2. In the first place, as shown in FIG. 2(a), a silicon dioxide film 104 having a thickness of 20 nm was formed on a silicon substrate 101 by the use of a CVD method. Afterward, a resist pattern 107 was formed by the use of a lithography technique. The formation of this resist pattern 107 was done in an area in which an element region would be formed later on.

Figure 2B:
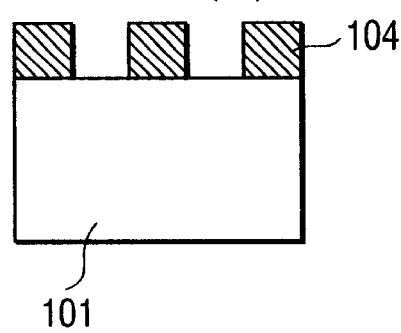

Next, as shown in FIG. 2(b), the unnecessary portion of the silicon dioxide film 104 was etched and removed through the resist pattern 107 as an etching mask by the use of an anisotropic dry etching technique. Afterward, the resist pattern 107 was removed by an ashing method.

Figure 2C:
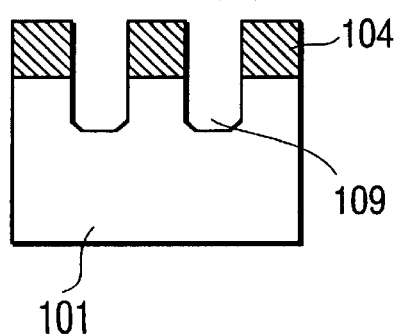

Next, as shown in FIG. 2(c), the silicon substrate 101 was etched to a depth of 300 nm through the remaining silicon dioxide film 104 as a mask by the use of the anisotropic dry etching technique to form trenches 109.

Figure 2D:
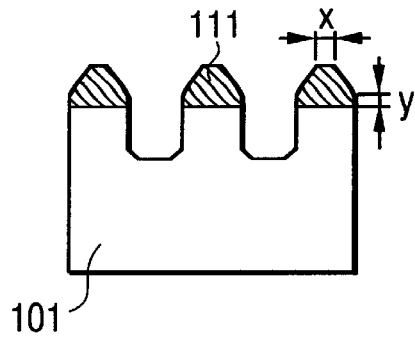

Next, as shown in FIG. 2(d), shoulder portions of the silicon dioxide film 104 used as the hard mask at the time of the formation of the trenches were etched by the use of a physical sputtering process to form a hard mask 111 into a taper shape. This physical sputtering process was carried out by using a parallel plate RIE apparatus and an argon gas as a sputtering gas at 200 sccm under 100 mTorr at an RF power of 400 W. In this example shown in FIG. 2(d), the hard mask 111 formed into the taper shape by the physical sputtering process has both of an upper flat portion x and a vertical side portion y, but needless to say, the physical sputtering process may be continued without any problem until both or either of the portions x and y is lost.

Figure 2E:
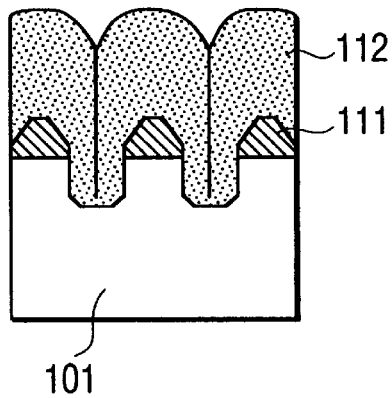

Next, as shown in FIG. 2(e), a silicon dioxide film 112 having a thickness of 500 nm was formed all over by the use of a CVD method. The thickness of this silicon dioxide film 112 is required to be sufficiently thicker than the depth of the trenches 109. Since the hard mask 111 arranged above the trenches 109 is formed into the taper shape, the silicon dioxide films 112 come in contact with each other in a corner above each trenches so that any void is not formed in the trench, even if the step coverage of the silicon dioxide film 112 deposited by the CVD method does not attain 100%.

Figure 2F:
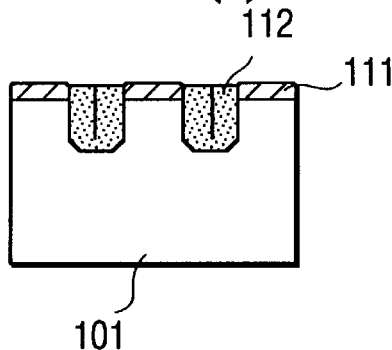

Next, as shown in FIG. 2(f), the silicon dioxide film 112 and the tapered hard mask 111 were polished back by the use of a CMP method. The polishing time of this polishing back is set so that the tapered hard mask 111 may be exposed but may not be lost.

Figure 2G:
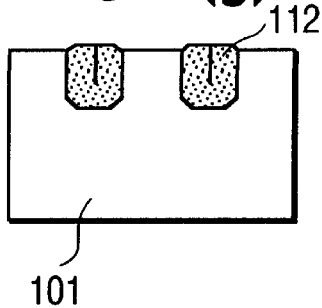
Figure 4A:
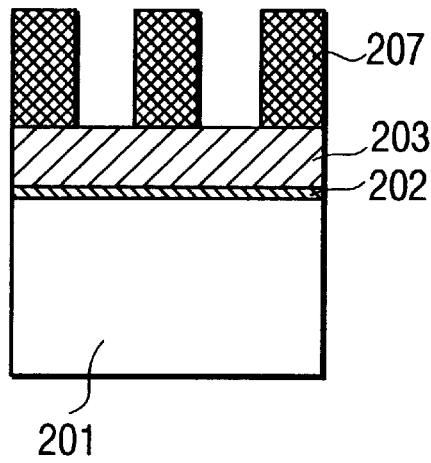
FIGS. 4(a)–(f) are sectional views of process steps illustrating a conventional technique.
Figure 4B:
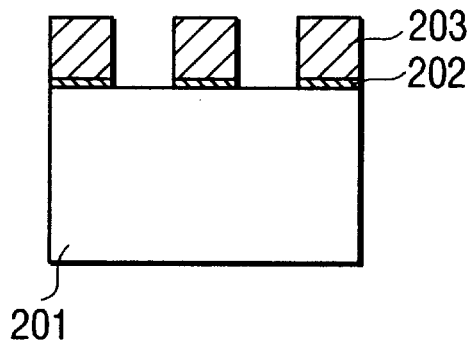
Figure 4C:
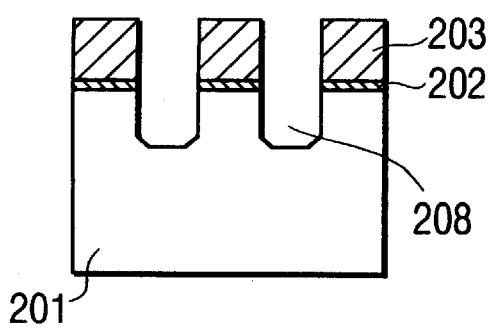
Figure 4D:
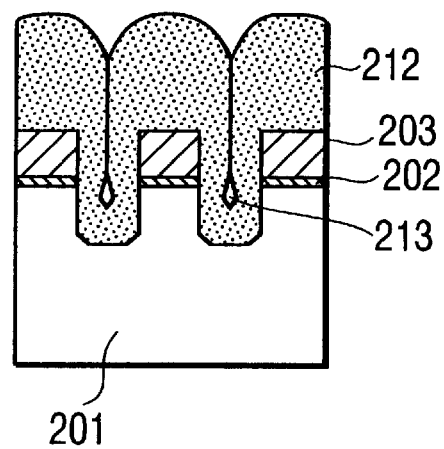
Figure 4E:
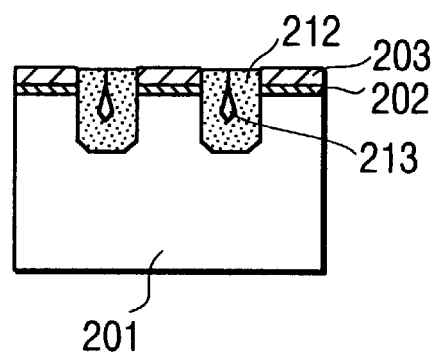
Figure 4F:
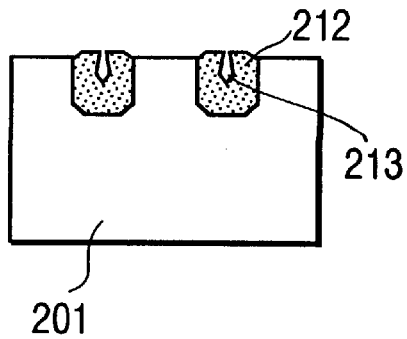
Figure 5A:
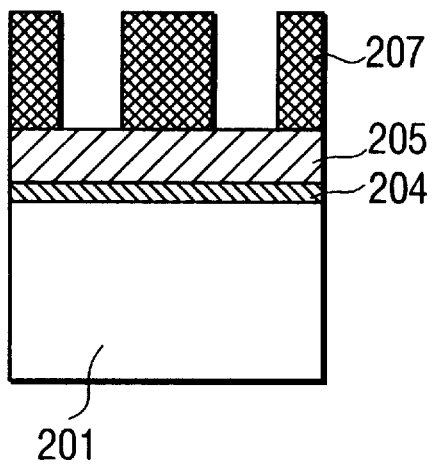
FIGS. 5(a)–(e) are sectional views of process steps illustrating another conventional technique.
Figure 5C:
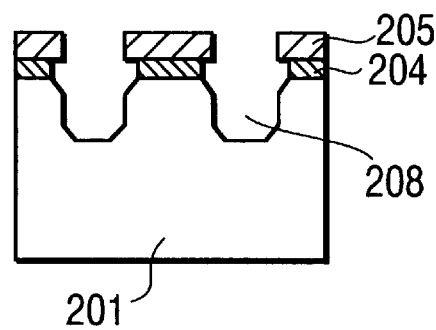
Figure 5B:
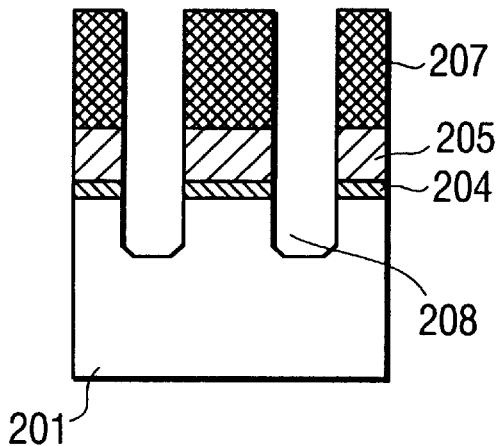
Figure 5D:
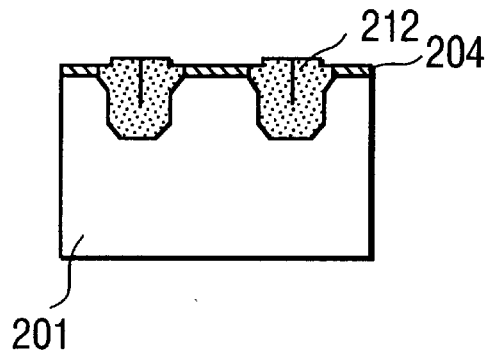
Figure 5E:
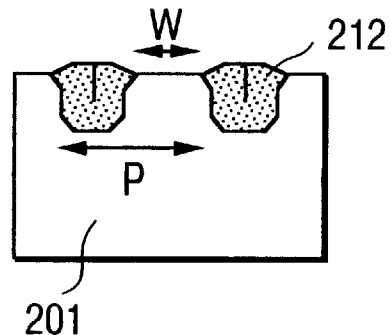

Next, as shown in FIG. 2(g), the remaining portion of the hard mask 111 polished back was wet-etched by an aqueous phosphoric acid solution to remove the same.

The second example is characterized in that the hard mask used at the time of the formation of the trenches 109 by etching the silicon substrate 101 is constituted of one layer of the silicon dioxide film alone. In contrast to the hard mask having the laminated structure of the silicon nitride film and the silicon dioxide film, the steps for the formation of the hard mask can be reduced. Additionally, also in the wet etching step after the CMP, the hard mask can be removed only by the etching with hydrofluoric acid, whereby the reduction of the steps can further be expected.

EXAMPLE 3

Next, the third example of the present invention will be described with reference to FIG. 3. In the first place, as shown in FIG. 3(a), a silicon dioxide film 105 having a thickness of 150 nm was formed on a silicon substrate 101 by the use of a thermal oxidation method. Next, a silicon nitride film 106 having a thickness of 100 nm was formed by a CVD method. Afterward, a resist pattern 107 was formed by the use of a lithography technique. The formation of this resist pattern 107 was done in an area in which an element region would be formed later on.

Next, as shown in FIG. 3(b), the unnecessary portion of the silicon nitride film 106 was etched and removed through the resist pattern 107 as an etching mask by the use of an anisotropic dry etching technique. Afterward, the resist pattern 107 was removed by an ashing method. Next, as shown in FIG. 3(c), the silicon dioxide film 105 was wet-etched through the remaining silicon nitride film 106 as an etching mask by the use of an isotropic wet etching technique. The wet etching is isotropic, and there is given an undercut which is larger than an opening diameter of the silicon nitride film 106 as the mask. By this wet etching, the silicon dioxide film 105 wa formed into such a shape as is shown in FIG. 3(c), whereby a tapered silicon dioxide 108 is formed.

Next, as shown in FIG. 3(d), the silicon substrate 101 was subjected to an anisotropic dry etching to a depth of 300 nm through the silicon nitride film 106 as a mask, thereby forming trenches 109.

Next, as shown in FIG. 3(e), the silicon nitride film 106 was wet-etched by a heated aqueous phosphoric acid solution to remove the same. In succession, a silicon dioxide film 112 having a thickness of 500 nm was formed all over by the use of a CVD method. The thickness of this silicon dioxide film 112 is required to be sufficiently thicker than the depth of the trenches 109. Since the silicon dioxide film 108 arranged above the trenches 109 is formed into a taper shape, the silicon dioxide films 112 come in contact with each other in a corner above each trenches o that any void is not formed in the trench, even if the step coverage of the silicon dioxide film deposited by the CVD method does not attain 100%.

Next, as shown in FIG. 3(f), the silicon dioxide film 112 and the tapered silicon dioxide film 108 were polished back by the use of a CMP method. The polishing time of this polishing back is set so that the tapered silicon dioxide film 108 may be exposed but may not be lost. Next, as shown in FIG. 3(g), the remaining portion of the tapered silicon dioxide film 108 polished back was wet-etched by an aqueous phosphoric acid solution to remove the same.

The feature of the third example is that the tapered silicon dioxide film is formed above the trenches by the isotropic wet etching. In consequence, a taper processing is easy.

What is claimed is:

1. A method for manufacturing a semiconductor device having an element isolation region comprising the steps of:
   a) forming an insulating film on the surface of a semiconductor substrate,
   b) forming an insulating film mask by etching the insulating film into a predetermined shape,
   c) forming a trench by etching the semiconductor substrate through the insulating film mask,
   d) processing the insulating film mask into a taper shape using a physical sputtering process so that the width of the upper portion of the insulating film mask is smaller than that of the lower portion thereof, and
   e) burying an insulating material into the trench wherein the order of steps is one of (1): a), b), c), d), and e) and (2): a), b), d), c) and e).

2. The method for manufacturing a semiconductor device according to claim 1, wherein the insulating film mask comprises one of (1) a silicon oxide film and (2) a laminated film o the silicon oxide film and a silicon nitride film.

3. The method for manufacturing a semiconductor device according to claim 1, wherein the burying stop includes completely filling said trench with said insulating material.

4. A method for manufacturing a semiconductor device having an element isolation region which at least comprises steps of:
   forming a first insulating film on the surface of a semiconductor substrate,
   forming a second insulating film on the first insulating film,
   subjecting the second insulating film to an anisotropic dry etching to accomplish patterning,
   wet-etching the first insulating film through the second patterned insulating film as a mask by the use of an agent capable of etching the first insulating film to process the first insulating film into a taper shape so that the width of the upper portion of the first insulating film is smaller than that of the lower portion thereof,
   etching the semiconductor substrate to form a trench, and
   burying an insulating material into the trench.

5. The method for manufacturing a semiconductor device according to claim 4, wherein the first insulating film is a silicon oxide film, and the second insulating film is a silicon nitride film.

6. A method for manufacturing a semiconductor device having an element isolation region comprising the steps of:
   a) forming an insulating film on the surface of a semiconductor substrate,
   b) forming an insulating film mask by etching the insulating film into a predetermined shape,
   c) forming a trench by etching the semiconductor substrate through the insulating film mask, said trench having a straight sidewall and a top corner with a substantially right angle,
   d) processing the insulating mask into a tapered shape so that the width of the upper portion of the mask is smaller than that of the lower portion thereof, and
   e) burying an insulating material into the trench, wherein the order of steps is one of (1): a), b), c), d), and e) and (2): a), b), d), c) and e).

7. The method as reciting claim 6 wherein the method for manufacturing a semiconductor device according to claim 1, wherein the insulating film mask comprises one of (1) a silicon oxide film and (2) a laminated film of the silicon oxide film and a silicon nitride film.

8. The method as reciting claim 6 wherein the method for manufacturing a semiconductor device according to claim 1, wherein the burying step includes completely filling said trench with said insulating material.

9. The method as reciting claim 8 wherein the method for manufacturing a semiconductor device according to claim 1, wherein the insulating film mask comprises one of (1) a silicon oxide film and (2) a laminated film o the silicon oxide film and a silicon nitride film.

* * * * *